(12) United States Patent
Fukushima et al.

(10) Patent No.: US 11,676,632 B2
(45) Date of Patent: *Jun. 13, 2023

(54) MAGNETIC RECORDING MEDIUM, METHOD OF MANUFACTURING MAGNETIC RECORDING MEDIUM AND MAGNETIC STORAGE DEVICE

(71) Applicant: SHOWA DENKO K.K., Tokyo (JP)

(72) Inventors: Takayuki Fukushima, Chiba (JP); Lei Zhang, Chiba (JP); Chen Xu, Chiba (JP); Hisato Shibata, Chiba (JP); Takehiro Yamaguchi, Chiba (JP); Hiroshi Koyanagi, Chiba (JP); Yuji Umemoto, Chiba (JP)

(73) Assignee: RESONAC CORPORATION, Tokyo (JP)

( * ) Notice: Subject to any disclaimer, the term of this patent is extended or adjusted under 35 U.S.C. 154(b) by 226 days.

This patent is subject to a terminal disclaimer.

(21) Appl. No.: 17/104,504

(22) Filed: Nov. 25, 2020

(65) Prior Publication Data
US 2021/0201947 A1 Jul. 1, 2021

(30) Foreign Application Priority Data

Dec. 26, 2019 (JP) .............................. JP2019-235625
Mar. 5, 2020 (JP) .............................. JP2020-038097

(51) Int. Cl.
*G11B 5/73* (2006.01)
*G11B 5/851* (2006.01)
(Continued)

(52) U.S. Cl.
CPC .......... *G11B 5/736* (2019.05); *C23C 14/0057* (2013.01); *C23C 14/081* (2013.01);
(Continued)

(58) Field of Classification Search
CPC ....... G11B 5/736; G11B 5/716; G11B 5/7369; G11B 5/851; G11B 5/7257; G11B 5/7266;
(Continued)

(56) References Cited

U.S. PATENT DOCUMENTS 5,049,251 A * 9/1991 Inoue .................... C23C 14/564
204/192.12
10,008,220 B2 6/2018 Fukushima et al.
(Continued)

FOREIGN PATENT DOCUMENTS

CN 103226954 7/2013
JP 2014-041682 3/2014
(Continued)

OTHER PUBLICATIONS

WO-2013099832-A1 Translation (Year: 2013).*

*Primary Examiner* — Jennifer Wecker
*Assistant Examiner* — Patrick S Ott
(74) *Attorney, Agent, or Firm* — IPUSA, PLLC (57) ABSTRACT

The present invention relates to a magnetic recording medium including a substrate; an underlayer laminated upon the substrate; and a magnetic layer laminated upon the underlayer, wherein the underlayer includes a first underlayer containing a compound represented by a following general formula: $MgO_{(1-X)}$, where X is within a range of 0.07 to 0.25, the magnetic layer includes a first magnetic layer containing an alloy having a $L1_0$ structure, and the alloy having the $L1_0$ structure includes B, and the first underlayer is in contact with the first magnetic layer.

20 Claims, 3 Drawing Sheets

(51) Int. Cl.
  *C23C 14/08* (2006.01)
  *C23C 14/34* (2006.01)
  *C23C 14/00* (2006.01)
  *G11B 5/716* (2006.01)
  *C23C 14/35* (2006.01)

(52) U.S. Cl.
  CPC .............. *C23C 14/34* (2013.01); *C23C 14/35* (2013.01); *G11B 5/716* (2013.01); *G11B 5/7369* (2019.05); *G11B 5/851* (2013.01); *Y10T 428/115* (2015.01)

(58) Field of Classification Search
  CPC ... G11B 5/73921; G11B 5/70605; G11B 5/82; C23C 14/0057; C23C 14/081; C23C 14/34; C23C 14/35; Y10T 428/115
  See application file for complete search history.

(56) References Cited

U.S. PATENT DOCUMENTS

| | | |
|---|---|---|
| 10,923,150 B2 | 2/2021 | Moriya et al. |
| 11,043,238 B1 | 6/2021 | Yamaguchi et al. |
| 2003/0096140 A1* | 5/2003 | Tomiyasu ............ G11B 5/7266 |
| 2007/0072011 A1 | 3/2007 | Li et al. |
| 2009/0021164 A1* | 1/2009 | Maeshima ............... H01J 11/40 313/582 |
| 2010/0209736 A1* | 8/2010 | Hashimoto ............ G11B 5/667 428/815 |
| 2011/0165818 A1* | 7/2011 | Yamauchi ............... H01J 11/12 445/25 |
| 2013/0114165 A1* | 5/2013 | Mosendz ............. G11B 5/7264 360/244 |
| 2013/0194901 A1* | 8/2013 | Kanbe .................. G11B 5/7363 428/831 |
| 2014/0284539 A1* | 9/2014 | Eeh ........................ H01L 43/12 257/4 |
| 2016/0247608 A1* | 8/2016 | Choi ......................... C23C 2/10 |
| 2016/0358622 A1 | 12/2016 | Arora et al. |
| 2019/0287563 A1 | 9/2019 | Kataoka et al. |
| 2021/0201947 A1 | 7/2021 | Fukushima et al. |

FOREIGN PATENT DOCUMENTS

| | | | |
|---|---|---|---|
| JP | 2017-224371 | 12/2017 | |
| WO | WO-2013099832 A1 * | 7/2013 | ........... C04B 35/053 |

* cited by examiner

MAGNETIC RECORDING MEDIUM, METHOD OF MANUFACTURING MAGNETIC RECORDING MEDIUM AND MAGNETIC STORAGE DEVICE

CROSS-REFERENCE TO RELATED APPLICATIONS

This application is based upon and claims priority to Japanese Patent Application No. 2019-235625, filed on Dec. 26, 2019, and No. 2020-038097, filed on Mar. 5, 2020, the entire contents of which are incorporated herein by reference.

BACKGROUND OF THE INVENTION

Field of the Invention

The present disclosure relates to a magnetic recording medium, a method of manufacturing the magnetic recording medium, and a magnetic storage device.

Description of the Related Art

A thermal assist recording technique by irradiating the magnetic recording medium with near-field light or the like and locally heating the surface of the magnetic recording medium, has been attracting attention as a next generation recording method that can achieve a surface recording density of 1 Tbit/inch$^2$ class. Using the thermal assist recording method, magnetic information can be easily recorded on a magnetic recording medium having a coercivity of several tens of kOe at room temperature by the magnetic recording field of the magnetic head. Therefore, a material having a high crystalline magnetic anisotropy constant (Ku) of $10^6$ J/m$^3$ (a high Ku material) can be applied to the magnetic layer, and as a result, the magnetic particles constituting the magnetic layer can be refined until the particle diameter is 6 nm or less while maintaining the thermal stability.

Alloys having an $L1_0$ structure such as FePt alloy (constant Ku to $7 \times 10^6$ J/m$^3$) and CoPt alloy (constant Ku to $5 \times 10^6$ J/m$^3$) are known as high Ku materials.

In order to improve the surface recording density of the thermal assist magnetic recording medium, it is preferable to improve the electromagnetic conversion characteristics of the thermal assist magnetic recording medium by improving the crystal orientation of the magnetic layer, refining the magnetic particles constituting the magnetic layer, and reducing the exchange coupling between the magnetic particles.

For example, when a FePt alloy film is used as the magnetic layer, the FePt alloy film is to be (001)-oriented in order to improve the crystal orientation of the magnetic layer. Therefore, it is desirable to use a (100)-oriented MgO layer as the underlayer. Here, since the (100) surface of MgO is highly lattice-matched with the (001) plane of the FePt alloy having the $L1_0$ structure, the FePt alloy film can be (001)-oriented by depositing the FePt alloy film on the MgO layer.

Patent Document 1 discloses a sputtering target for forming a magnetic recording medium film including a sintered body having a composition represented by the general formula $\{(Fe_xPt_{100-x})_{(100-y)}B_y\}_{(100-z)}C_z$ and having the atomic ratio of $30 \leq x \leq 80$, $1 \leq y \leq 20$, and $3 \leq z \leq 65$.

RELATED ART DOCUMENTS

Patent Documents

Patent Document 1: Japanese Patent Application Laid-Open No. 2014-41682

SUMMARY OF THE INVENTION

Problem to be Solved by the Invention

There is an ever-present demand to improve the surface recording density of the magnetic recording medium. As such, and it is preferable to improve the electromagnetic conversion characteristics of the magnetic recording medium. For this purpose, it is preferable to improve the regularity of the magnetic film and the orientation of the magnetic layer.

Therefore, it is conceivable that a FePtB alloy film is used as the magnetic layer.

However, when a FePtB alloy film is deposited on the MgO layer, the B in the FePtB alloy interdiffuses with the oxygen in the MgO to form boron oxide, and as a result, the (001)-orientation of the FePtB alloy film is reduced.

An aspect of the present invention is to provide a magnetic recording medium capable of improving the (001)-orientation of the magnetic layer.

Means for Solving Problems (1) A magnetic recording medium includes; a substrate; an underlayer laminated upon the substrate; and a magnetic layer laminated upon the underlayer, wherein the underlayer includes a first underlayer containing a compound represented by a following general formula:

$MgO_{(1-X)}$ where X is within a range of 0.07 to 0.25, the magnetic layer includes a first magnetic layer containing an alloy having a $L1_0$ structure, and the alloy having the $L1_0$ structure includes B, and the first underlayer is in contact with the first magnetic layer.

(2) A method of manufacturing the magnetic recording medium of (1), the method includes: depositing the first underlayer with a sputtering target containing MgO and a sputtering gas in which hydrogen is added in a range of 1% by volume to 20% by volume to an inert gas.

(3) A method of manufacturing the magnetic recording medium of (1), the method includes: discharging a sputtering target containing MgO for a period of less than or equal to 0.5 seconds at a sputtering gas pressure of more than or equal to 1 Pa; discharging the sputtering target at a sputtering gas pressure of less than or equal to 0.5 Pa; and depositing the first underlayer.

(4) A magnetic storage device including the magnetic recording medium of (1).

Effects of the Invention

According to an aspect of the present invention, a magnetic recording medium capable of improving the (001)-orientation of the magnetic layer can be provided.

DESCRIPTION OF THE PREFERRED EMBODIMENTS

Hereinafter, an embodiment for carrying out the present invention will be described with reference to the drawings. In the drawings used in the following description, a portion representing a characteristic may be enlarged to clarify the characteristic, and the dimensional proportions of each component are not necessarily the same.

[Magnetic Recording Medium]

Figure 1:
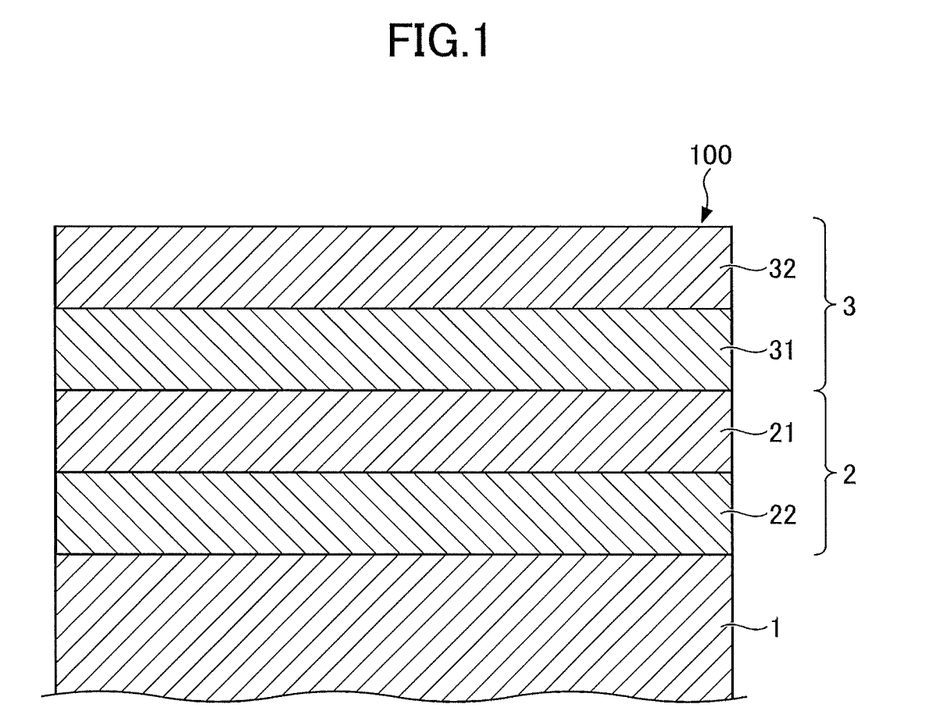
FIG. 1 is a cross-sectional view illustrating an example of a layer structure of a magnetic recording medium according to an embodiment.

FIG. 1 illustrates an example of the layer structure of the magnetic recording medium according to the present embodiment.

A magnetic recording medium 100 includes a substrate 1, an underlayer 2 laminated upon the substrate, and a magnetic layer 3 laminated upon the underlayer. The magnetic layer 3 contains an alloy having an $L1_0$ structure.

Here, in the underlayer 2, the second underlayer 22 and the first underlayer 21 are sequentially laminated, and in the magnetic layer 3, the first magnetic layer 31 and the second magnetic layer 32 are sequentially laminated.

The number of layers in the underlayer 2 and the magnetic layer 3 is not particularly limited, and each may be three or more.

The first underlayer 21 is the top layer (the layer farthest from the substrate 1) of the underlayer 2. The first underlayer 21 includes a compound represented by the following general formula:

$$MgO_{(1-X)} \tag{A}$$

where X is in the range of 0.07 to 0.25.

The first magnetic layer 31 is the bottom layer (the layer closest to the substrate 1) of the magnetic layer 3. The first magnetic layer 31 contains an alloy having an $L1_0$ structure, and the alloy having an $L1_0$ structure includes B (boron).

Since the first underlayer 21 is in contact with the first magnetic layer 31, the interdiffusion between oxygen in the first underlayer 21 and B in the first magnetic layer 31 is reduced, thereby improving the (001)-orientation of the magnetic layer 3. This is because the first underlayer 21 is in a state where oxygen is deficient in the stoichiometry (stoichiometric composition) of MgO, so that the supply of oxygen to the first magnetic layer 31 is suppressed, and the oxidation of the alloy B that constitutes the $L1_0$ structure contained in the first magnetic layer 31 is reduced.

The amount of deficient oxygen x in the compound represented by the general formula (A) is in the range of 0.07 to 0.25, and preferably in the range of 0.10 to 0.20. When the amount of deficient oxygen x in the compound is less than 0.07, boron oxide is formed by partially oxidizing B, which is an alloy having the $L1_0$ structure included in the first magnetic layer 31, and the boron oxide moves to the grain boundary. Therefore, the (001)-orientation of the magnetic layer 3 is reduced. In contrast, when the amount of deficient oxygen x in the compound is greater than 0.25, the lattice constant of the compound represented by the general formula (A) included in the first underlayer 21 is reduced, and the c-axis selective orientation of the alloy having the $L1_0$ structure included in the first magnetic layer 31 is hindered. Therefore, the (001)-orientation of the magnetic layer 3 is reduced.

The amount of deficient oxygen x in the compound can be measured, for example, by known methods such as expansion and contraction of the lattice constant in MgO by X-ray diffraction, secondary ion mass spectrometry (SIMS), electron probe microanalysis (EPMA), and X-ray photoelectron spectroscopy (XPS).

The first underlayer 21 can be deposited by sputtering.

When depositing the first underlayer 21, it is preferable to deposit the first underlayer 21 using a sputtering target containing MgO and a sputtering gas in which hydrogen is added in the range of 1% by volume to 20% by volume to the inert gas. This reduces MgO and allows formation of a film containing oxygen-deficient magnesium oxide, i.e., a compound of the general formula (A).

When depositing the first underlayer 21, it is preferable that a sputtering target containing MgO is used to discharge for a period of less than or equal to 0.5 seconds at a sputtering gas pressure of more than or equal to 1 Pa, and then discharge at a sputtering gas pressure of less than or equal to 0.5 Pa.

Since MgO is an insulation material, the RF sputtering method is used to deposit the first underlayer 21. However, by discharging for a period of less than or equal to 0.5 seconds at a sputtering gas pressure of more than or equal to 1 Pa, the MgO can be stably discharged at a sputtering gas pressure of less than or equal to 0.5 Pa, and thus a film containing highly crystalline, oxygen-deficient magnesium oxide can be formed.

In addition, by discharging at a sputtering gas pressure of less than or equal to 0.5 Pa, a film containing magnesium oxide, which is stably deficient in oxygen, can be formed. The reason why a film containing stable oxygen-deficient magnesium oxide can be formed is as follows. During discharge, oxygen atoms separated from Mg recombine with oxygen atoms to form oxygen molecules, but some oxygen molecules usually adsorb to the chamber walls. Here, when the sputtering gas pressure is less than or equal to 0.5 Pa, the amount of oxygen molecules released from the chamber wall is small. Therefore, the magnesium oxide can be put in the oxygen-deficient state.

The alloy having the $L1_0$ structure constituting the first magnetic layer 31 further preferably contains Pt together with Fe or Co.

The content of B in the alloy having the $L1_0$ structure is preferably in the range of 2% by mol to 20% by mol, more preferably in the range of 2.5% by mol to 10% by mol. When the content of B in the alloy having the $L1_0$ structure is 2% by mol or more, the (001)-orientation of the magnetic layer 3 is improved. When the content is 20% by mol or less, the magnetization of the magnetic particles constituting the first magnetic layer 31 is improved. As a result, the magnetic recording signal strength of the magnetic recording medium 100 is improved.

The first magnetic layer 31 further contains a grain boundary segregated material and may have a granular structure. This makes it easier for the first magnetic layer 31 to have the (001)-orientation. Therefore, a lattice matching of the (001)-oriented first magnetic layer 31 with the (100)-oriented first underlayer 21 improves.

Examples of the grain boundary segregated material included in the first magnetic layer 31 include nitrides such as VN, BN, SiN, TiN, and the like; carbides such as C, VC, and the like; and borides such as BN and the like. Two or more type of materials may be used in combination.

The material constituting the second underlayer 22 is not particularly limited as long as the first magnetic layer 31 can be (001)-oriented. Examples of the material constituting the second underlayer 22 include (100)-oriented W, a Cr alloy having BCC structure, an alloy having B2 structure, and the like.

Examples of Cr alloys having a BCC structure include a CrMn alloy, a CrMo alloy, a CrW alloy, a CrV alloy, a CrTi alloy, a CrRu alloy, and the like.

Examples of alloys having a B2 structure include a RuAl alloy, a NiAl alloy, and the like.

When the number of layers of the underlayer 2 is three or more, any underlayers other than the first underlayer 21 are the same as the second underlayer 22.

The second magnetic layer 32 preferably contains an alloy having an $L1_0$ structure. This improves the (001)-orientation of the magnetic layer 3. That is, as the second magnetic layer 32, an epitaxially grown magnetic film can be formed along the orientation of the first magnetic layer 31.

The alloy having the $L1_0$ structure included in the second magnetic layer 32 may, but not necessarily so, include B.

An alloy having an $L1_0$ structure that constitutes the second magnetic layer 32 contains Pt together with Fe or Co.

The second magnetic layer 32 further contains a grain boundary segregated material and may have a granular structure.

Examples of the materials contained in the second magnetic layer 32 include nitrides such as VN, BN, SiN, TiN, and the like; carbides such as C, VC, and the like; borides such as BN and the like; and oxides such as $SiO_2$, $TiO_2$, $Cr_2O_3$, $Al_2O_3$, $Ta_2O_5$, $ZrO_2$, $Y_2O_3$, $CeO_2$, MnO, TiO, ZnO, and the like. Two or more types of materials may be used in combination.

When the number of layers in the magnetic layer 3 is three or more, any magnetic layers other than the first magnetic layer 31 are the same as the second magnetic layer 32.

The magnetic recording medium 100 preferably has a protective layer deposited on the magnetic layer 3.

Examples of the deposition method of the protective layer include, but are not limited to, a Radio Frequency-Chemical Vapor Deposition (RF-CVD) method in which the raw gas composed of hydrocarbons is deposited by decomposing the raw gas using a high frequency plasma, an Ion Beam Deposition (IBD) method in which the raw gas is deposited by ionizing the raw gas using electrons emitted from the filament, and a Filtered Cathodic Vacuum Arc (FCVA) method in which the raw gas is deposited using a solid carbon target without using the raw gas.

The thickness of the protective layer is preferably in the range of 1 nm to 6 nm. When the thickness of the protective layer is 1 nm or more, the floating characteristics of the magnetic head are favorable. When the thickness is 6 nm or less, the magnetic spacing is reduced, and the SNR of the magnetic recording medium 100 is improved.

The magnetic recording medium 100 may have a lubricant layer on the protective layer.

Examples of the material constituting the lubricant layer include a fluororesin such as perfluoropolyether.

[Magnetic Storage Device]

The magnetic storage device according to the present embodiment is not particularly limited as long as the magnetic recording medium according to the present embodiment is provided.

The magnetic storage device according to the present embodiment includes, for example, a magnetic recording medium drive unit that rotates the magnetic recording medium according to the present embodiment, a magnetic head having, at the tip thereof, a near-field light-generating element, a magnetic head driving unit that moves the magnetic head, and a recording and reproducing signal processing system.

The magnetic head includes, for example, a laser light generator that heats the magnetic recording medium according to the present embodiment and a waveguide that guides laser light generated from the laser light generator to the near-field light-generating element.

Figure 2:
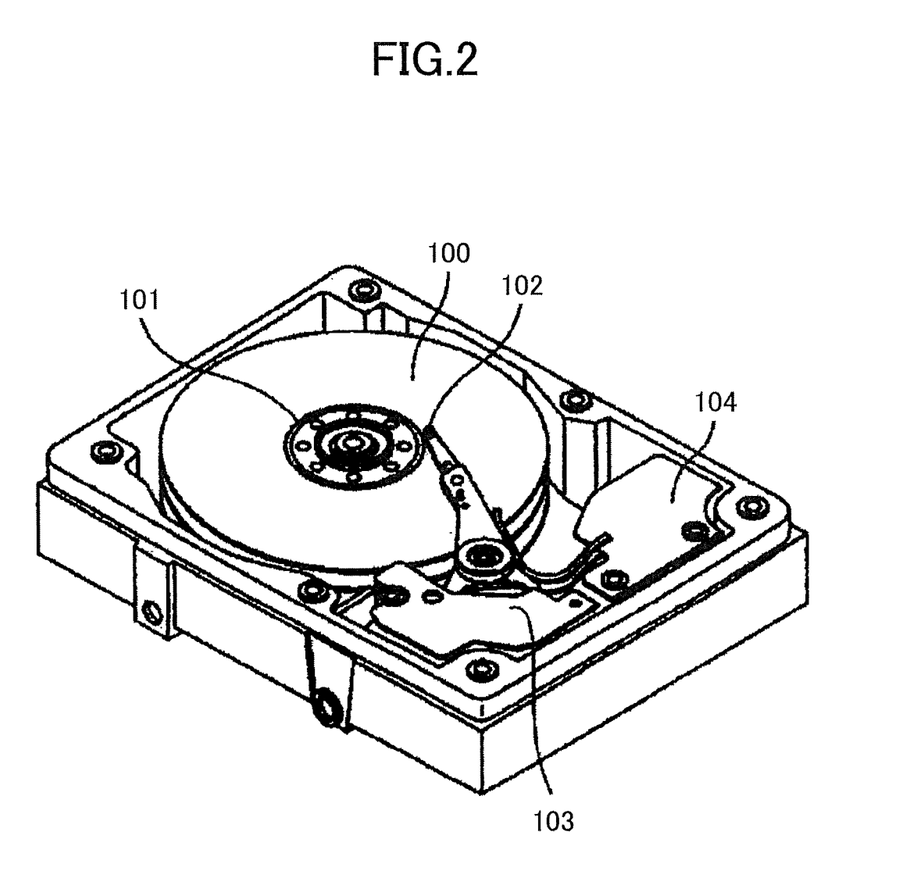
FIG. 2 is a perspective view illustrating an example of a magnetic storage device according to an embodiment.

FIG. 2 illustrates an example of a magnetic storage device according to the present embodiment.

The magnetic storage device of FIG. 2 includes a magnetic recording medium 100, a magnetic recording medium drive unit 101 that rotates the magnetic recording medium 100, a magnetic head 102, a magnetic head drive unit 103 that moves the magnetic head, and a recording and reproducing signal processing system 104.

Figure 3:
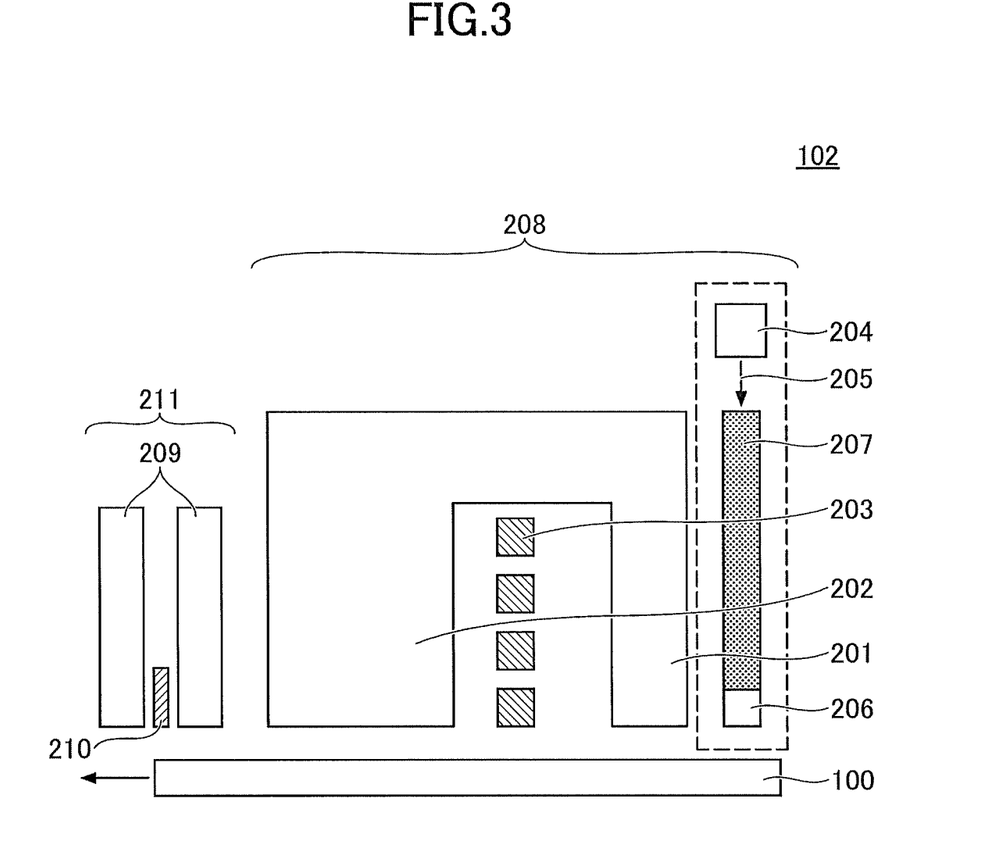
FIG. 3 is a schematic diagram showing an example of a magnetic head of FIG. 2.

An example of the magnetic head 102 is shown in FIG. 3.

The magnetic head 102 includes a recording head 208 and a reproducing head 211.

The recording head 208 has a main pole 201, an auxiliary pole 202, a coil 203 that generates a magnetic field, a laser diode (LD) 204 as a laser light generator, and a waveguide 207 that transmits laser light 205 generated from the LD 204 to the near-field light-generating element 206.

The reproducing head 211 has a reproducing element 210 sandwiched between the shields 209.

EXAMPLES

Hereinafter, examples of the present invention will be described. The present invention is not limited to examples, and modifications may be made without departing from the gist thereof.

Example 1

A 50 at % Cr-50 at % Ti alloy film (a film containing an alloy having 50% by atom of Cr and 50% by atom of Ti) (third underlayer) with a thickness of 50 nm and a 75 at % Co-20 at % Ta-5 at % B alloy film (a film containing an alloy having 75% by atom of Co, 20% by atom of Ta, and 5% by atom of B) (soft magnetic underlayer) with a thickness of 25 nm were deposited on the heat-resistant glass substrate in this order. Then, after the substrate was heated to 250° C., a Cr film (the second underlayer) with a thickness of 10 nm was deposited. At this time, a DC magnetron sputtering device was used for depositing the third underlayer, the soft magnetic underlayer, and the second underlayer.

Next, a first underlayer was deposited using an RF sputtering apparatus. Specifically, a sputtering gas pressure of 3 Pa was discharged for 12 seconds, and a $MgO_{(1-x)}$ film with a thickness of 2 nm was deposited. At this time, MgO was used as the sputtering target, and argon containing 10% by volume of hydrogen was used as the sputtering gas.

After the first underlayer was deposited, the amount of deficient oxygen x in the first underlayer was measured by XPS.

Then, after the substrate was heated to 520° C., a 60 mol % (47.5 at % Fe-47.5 at % Pt-5 at % B)-40 mol % C film (first magnetic layer) with a thickness of 3 nm, and a 82 mol %(52 at % Fe-48 at % Pt)-18 mol % $SiO_2$ film (second magnetic layer) with a thickness of 5 nm were deposited on the substrate in this order. At this time, a DC magnetron sputtering device was used as the deposition of the first magnetic layer and the second magnetic layer.

Next, a carbon film (protective layer) with a thickness of 3 nm was deposited using an ion beam method, and a perfluoropolyether film (lubricant layer) was deposited by a coating method, thereby obtaining a magnetic recording medium.

Example 2

The magnetic recording medium was manufactured in the same manner as in Example 1 except that the first underlayer was deposited as follows using an RF sputtering apparatus.

Specifically, after discharging the sputtering gas pressure as 3 Pa for 0.3 seconds, the sputtering gas pressure as 0.1 Pa was discharged for 12 seconds, and a $MgO_{(1-X)}$ film with a thickness of 2 nm was deposited. At this time, MgO was used as the sputtering target, and argon containing 10% by volume of hydrogen was used as the sputtering gas.

Examples 3 to 7, Comparative Examples 1 to 4

The magnetic recording medium was manufactured in the same manner as in Example 1, except that the deposition conditions of the first underlayer and the first magnetic layer were changed as shown in Table 1.

Examples 8 to 10

The magnetic recording medium was manufactured in the same manner as in Example 2, except that the deposition conditions of the first underlayer and the first magnetic layer were changed as shown in Table 1.

The sputtering gas pressures according to Examples 2 and 8 to 10 described in Table 1 are the sputtering gas pressures when discharging for 12 seconds after discharging at 3 Pa for 0.3 seconds.

((100)-Orientation of Magnetic Layer)

The X-ray diffraction spectrum of the substrate after deposition of the second magnetic layer was measured using an X-ray diffraction device (manufactured by Philips) to determine the half-maximum width of the (200)-peak in the FePt alloy.

Note that, the (001)-orientation of the magnetic layer was evaluated using the half-maximum width of rocking curve of the (200)-peak in the FePt alloy having the $L1_0$ structure contained in the magnetic layer. Here, the (001)-peak angle 2θ of the FePt alloy was not sufficiently high.

Therefore, even if the lower angle side was extended to the measurement limit when measuring the rocking curve, the intensity of the (001)-peak of the FePt alloy was not stable in the absence of the peak, and it was difficult to analyze the half-maximum width. For these measurement reasons, it was difficult to evaluate the (001)-orientation of the magnetic layer using the half-maximum width of the (100)-peak in the FePt alloy. In contrast, the (200)-peak of the FePt alloy appeared when the FePt alloy was (001)-oriented, but was suitable for evaluating the (001)-orientation of the magnetic layer because the angle 2θ was sufficiently large in the (200)-peak of the FePt alloy.

Table 1 shows the evaluation results of the (001)-orientation in the magnetic layer of the magnetic recording medium.

TABLE 1

| | Sputtering gas | | | | Sputtering gas pressure [Pa] | x of first underlayer | First magnetic layer | Half-maximum width of the (200)-peak in the FePt alloy [°] |
|---|---|---|---|---|---|---|---|---|
| | Type | Amount (vol %) | Type | Amount (vol %) | | | | |
| Example 1 | Ar | 90 | $H_2$ | 10 | 3 | 0.15 | 60 mol % (47.5 at % Fe 47.5 at % Pt 5 at % B)-40 mol % C | 6.1 |
| Example 2 | Ar | 90 | $H_2$ | 10 | 0.1 | 0.16 | 60 mol % (47.5 at % Fe 47.5 at % Pt 5 at % B)-40 mol % C | 6.0 |
| Example 3 | Ar | 99 | $H_2$ | 1 | 3 | 0.12 | 60 mol % (47.5 at % Fe 47.5 at % Pt 5 at % B)-40 mol % C | 6.5 |
| Example 4 | Ar | 96 | $H_2$ | 4 | 3 | 0.13 | 60 mol % (47.5 at % Fe 47.5 at % Pt 5 at % B)-40 mol % C | 6.3 |
| Example 5 | Ar | 96 | $H_2$ | 4 | 3 | 0.13 | 60 mol % (50 at % Fe 47.5 at % Pt 2.5 at % B)-40 mol % C | 7.2 |
| Example 6 | Ar | 96 | $H_2$ | 4 | 3 | 0.13 | 60 mol % (42.5 at % Fe 47.5 at % Pt 10 at % B)-40 mol % C | 6.1 |
| Example 7 | Ar | 80 | $H_2$ | 20 | 3 | 0.20 | 60 mol % (47.5 at % Fe 47.5 at % Pt 5 at % B)-40 mol % C | 6.1 |
| Example 8 | Ar | 100 | — | — | 0.1 | 0.12 | 60 mol % (47.5 at % Fe 47.5 at % Pt 5 at % B)-40 mol % C | 6.6 |
| Example 9 | Ar | 100 | — | — | 0.3 | 0.10 | 60 mol % (47.5 at % Fe 47.5 at % Pt 5 at % B)-40 mol % C | 6.8 |
| Example 10 | Ar | 100 | — | — | 0.5 | 0.09 | 60 mol % (47.5 at % Fe 47.5 at % Pt 5 at % B)-40 mol % C | 6.8 |
| Comparative Example 1 | Ar | 100 | — | — | 3 | 0.05 | 60 mol % (47.5 at % Fe 47.5 at % Pt 5 at % B)-40 mol % C | 7.6 |
| Comparative Example 2 | Ar | 100 | — | — | 7 | 0 | 60 mol % (47.5 at % Fe 47.5 at % Pt 5 at % B)-40 mol % C | 8.0 |
| Comparative Example 3 | Ar | 100 | — | — | 3 | 0.05 | 60 mol % (50 at % Fe 50 at % Pt)-40 mol % C | 8.1 |
| Comparative Example 4 | Ar | 100 | — | — | 7 | 0 | 60 mol % (50 at % Fe 50 at % Pt)-40 mol % C | 8.5 |

From Table 1, it can be seen that the magnetic recording medium according to Examples 1 to 10 has a small half-maximum width of the (200)-peak of the FePt alloy and has a high (001)-orientation in the magnetic layer.

In contrast, in the magnetic recording media of Comparative Examples 1 and 2, the x of the first underlayer were in the range of 0 to 0.05. As a result, the half-maximum width of the (200)-peak of the FePt alloy was large, and the (001)-orientation in the magnetic layer was low.

In the magnetic recording media of Comparative Examples 3 and 4, the x of the first underlayer were in the range of 0 to 0.05 and the first magnetic layer did not include B. As a result, the half-maximum width of the (200)-peak in the FePt alloy was large, and the (001)-orientation in the magnetic layer was low.

DESCRIPTION OF THE REFERENCE NUMERALS

1 Substrate
2 Underlayer
21 First underlayer
22 Second underlayer
3 Magnetic layer
31 First magnetic layer
32 Second magnetic layer
100 Magnetic recording medium

What is claimed is:

1. A thermal assist magnetic recording medium comprising:
   a substrate;
   an underlayer provided on the substrate; and
   a magnetic recording layer provided on the underlayer, wherein
   the underlayer includes a first underlayer including a compound represented by a formula $MgO_{(1-X)}$, where X falls within a range of 0.07 to 0.25,
   the magnetic recording layer includes a first magnetic layer consisting of an alloy having a $L1_0$ structure and including B, and a second magnetic layer consisting of an alloy having a $L1_0$ structure and provided on the first magnetic layer,
   the first underlayer is in contact with the first magnetic layer.

2. The thermal assist magnetic recording medium as claimed in claim 1, wherein a B-content in the alloy of the first magnetic layer having the $L1_0$ structure falls within a range of 2% by mol to 20% by mol.

3. The thermal assist magnetic recording medium as claimed in claim 1, wherein a B-content in the alloy of the first magnetic layer having the $L1_0$ structure falls within a range of 2.5% by mol to 10% by mol.

4. The thermal assist magnetic recording medium as claimed in claim 1, wherein
   the underlayer further includes a second underlayer,
   the first underlayer is provided on the second underlayer, and sandwiched between the second underlayer and the first magnetic layer, and
   the second underlayer is selected from group consisting of (100)-oriented W, Cr, Cr alloys having a BCC structure, and Al alloys having B2 structure.

5. The thermal assist magnetic recording medium as claimed in claim 1, wherein
   the alloy of the second magnetic layer is selected from a group consisting of a first alloy having a $L1_0$ structure and including B, a second alloy having a $L1_0$ structure and including Pt, and Fe or Co, and a third alloy having a $L1_0$ structure and including B, Pt, and Fe or Co.

6. The thermal assist magnetic recording medium as claimed in claim 5, wherein at least one of the first magnetic layer and the second magnetic layer has a granular structure.

7. The thermal assist magnetic recording medium as claimed in claim 1, wherein
   the substrate has a substrate surface on which the underlayer is provided, and
   each of the first magnetic layer and the second magnetic layer is (001)-oriented.

8. A method of manufacturing the thermal assist magnetic recording medium of claim 1, the method comprising:
   depositing the first underlayer using a sputtering target including MgO, and a sputtering gas in which an amount of hydrogen added to an inert gas falls within a range of 1% by volume to 20% by volume.

9. A method of manufacturing the thermal assist magnetic recording medium of claim 1, the method comprising:
   depositing the first underlayer using a sputtering target including MgO, by causing discharge for a period of less than or equal to 0.5 second at a first sputtering gas pressure of 1 Pa or higher, and thereafter causing discharge at a second sputtering gas pressure of 0.5 Pa or lower.

10. A magnetic storage device comprising:
    the thermal assist magnetic recording medium according to claim 1; and
    a magnetic head configured to record information on and reproduce information from the thermal assist perpendicular magnetic recording medium.

11. A thermal assist magnetic recording medium comprising:
    a substrate;
    an underlayer provided on the substrate; and
    a magnetic recording layer provided on the underlayer, wherein
    the underlayer includes a first underlayer including a compound represented by a formula $MgO_{(1-X)}$, where X falls within a range of 0.07 to 0.25,
    the magnetic recording layer includes a first magnetic layer consisting of an alloy having a $L1_0$ structure and including B, Pt, and Fe or Co, and a second magnetic layer consisting of an alloy having a $L1_0$ structure and provided on the first magnetic layer,
    the first underlayer is in contact with the first magnetic layer.

12. The thermal assist magnetic recording medium as claimed in claim 11, wherein a B-content in the alloy of the first magnetic layer having the $L1_0$ structure falls within a range of 2% by mol to 20% by mol.

13. The thermal assist magnetic recording medium as claimed in claim 11, wherein a B-content in the alloy of the first magnetic layer having the $L1_0$ structure falls within a range of 2.5% by mol to $1_0$% by mol.

14. The thermal assist magnetic recording medium as claimed in claim 11, wherein
    the underlayer further includes a second underlayer,
    the first underlayer is provided on the second underlayer, and sandwiched between the second underlayer and the first magnetic layer, and
    the second underlayer is selected from a group consisting of a (100)-oriented W, Cr, Cr alloys having a BCC structure, and Al alloys having B2 structure.

15. The thermal assist magnetic recording medium as claimed in claim 11, wherein the alloy of the second magnetic layer is selected from a group consisting of a first alloy having a $L1_0$ structure and including B, a second alloy having a $L1_0$ structure and including Pt, and Fe or Co, and a third alloy having a $L1_0$ structure and including B, Pt, and Fe or Co.

16. The thermal assist magnetic recording medium as claimed in claim 15, wherein at least one of the first magnetic layer and the second magnetic layer has a granular structure.

17. The thermal assist magnetic recording medium as claimed in claim 11, wherein the substrate has a substrate surface on which the underlayer is provided, and each of the first magnetic layer and the second magnetic layer is (001)-oriented.

18. A method of manufacturing the thermal assist magnetic recording medium of claim 11, the method comprising:

depositing the first underlayer using a sputtering target including MgO, and a sputtering gas in which an amount of hydrogen added to an inert gas falls within a range of 1% by volume to 20% by volume.

19. A method of manufacturing the thermal assist magnetic recording medium of claim 11, the method comprising:

depositing the first underlayer using a sputtering target including MgO, by causing discharge for a period of less than or equal to 0.5 second at a first sputtering gas pressure of 1 Pa or higher, and thereafter causing discharge at a second sputtering gas pressure of 0.5 Pa or lower.

20. A magnetic storage device comprising:

the thermal assist magnetic recording medium according to claim 11; and a magnetic head configured to record information on and reproduce information from the thermal assist perpendicular magnetic recording medium.

* * * * *